(12) United States Patent
Koe et al.

(10) Patent No.: US 6,940,438 B2
(45) Date of Patent: Sep. 6, 2005

(54) METHOD AND CIRCUIT FOR REDUCING QUANTIZER INPUT/OUTPUT SWING IN A SIGMA-DELTA MODULATOR

(75) Inventors: Wem Ming Koe, Dallas, TX (US); Franco Maloberti, Plano, TX (US); James Robert Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/766,233

(22) Filed: Jan. 28, 2004

(65) Prior Publication Data

US 2005/0162296 A1 Jul. 28, 2005

(51) Int. Cl.[7] ................................. H03M 3/00
(52) U.S. Cl. ................. 341/143; 341/156; 341/176
(58) Field of Search ................. 341/143, 144, 341/156, 155, 176, 131

(56) References Cited

U.S. PATENT DOCUMENTS

| | | | | |
|---|---|---|---|---|
| 5,298,900 A | * | 3/1994 | Mauthe et al. | 341/143 |
| 5,654,711 A | * | 8/1997 | Fujimori | 341/143 |
| 6,111,531 A | * | 8/2000 | Farag | 341/143 |
| 6,271,782 B1 | * | 8/2001 | Steensgaard-Madsen | 341/143 |
| 6,400,297 B1 | * | 6/2002 | Tucker | 341/143 |
| 6,696,998 B2 | * | 2/2004 | Ying et al. | 341/143 |
| 6,762,703 B1 | * | 7/2004 | Tabatabaei | 341/143 |
| 6,809,672 B2 | * | 10/2004 | Gupta | 341/143 |

* cited by examiner

*Primary Examiner*—Lam T. Mai
(74) *Attorney, Agent, or Firm*—W. Daniel Swayze, Jr.; W. James Brady; Frederick J. Telecky, Jr.

(57) ABSTRACT

Disclosed is a circuit and method for reducing output swing in a sigma delta modulator. The quantizer output swing reduction circuit and method of the present invention advantageously enables the modulator to have a larger input/output swing range without degrading the SNR and SFDR performance. One embodiment of the present invention comprises a conventional sigma-delta modulation circuit (100) and a quantizer swing reduction block (210). The quantizer swing reduction block (210) comprises an input signal Vx (216), a signal processing block (214) with transfer function H3 and another signal processing block (215) with transfer function H2*H3.

32 Claims, 11 Drawing Sheets

METHOD AND CIRCUIT FOR REDUCING QUANTIZER INPUT/OUTPUT SWING IN A SIGMA-DELTA MODULATOR

TECHNICAL FIELD

The present invention relates to sigma-delta, sometimes referred to as delta-sigma, modulators used in analog-to-digital converter circuits, specifically a circuit and method for reducing the quantizer input/output swing in a sigma-delta modulator which enables the modulator to have a larger input/output signal swing before the signal at the input/output of the quantizer and the output of the last integrator saturates.

BACKGROUND OF THE INVENTION

Most signals of practical interest, such as speech, radar signals, sonar signals and various communication signals such as audio and video signals are analog. Often it is desirable to process these analog signals by digital means. To process an analog signal by digital means, it is necessary to convert the analog signal into digital form.

In analog-to-digital conversion, a smooth and continuous analog signal is converted or quantized into a sequence of numbers having finite precision with discrete values at discrete times. The devices that perform this task are called analog-to-digital ("A/D") converters ("ADC"). Modern demands for precise, fast processing of such digital signals coupled with the advances in very-large-scale integrated circuit ("VLSI") technology have resulted in the necessity for cost-effective and highly accurate ADC. There are generally two types of ADC commonly used for high-resolution application, sigma-delta modulator ADC and successive approximation register ("SAR") ADC. Sigma-delta modulator ADC have certain advantages over SAR ADC, when used for oversampled noise-shaping, including inherent linearity and high tolerance to circuit imperfection.

A sigma-delta ADC is generally comprised of (1) a sigma-delta modulator followed by (2) a digital decimation filter and a (3) low-pass filter. The sigma-delta modulator consists of an analog filter/integrator and an n-bit quantizer enclosed in a feedback loop via an m-bit DAC. The feedback DAC is implemented as an array of finite capacitors configured such that a selected number of these capacitors release their electrical charge into a summing junction that produces an equivalent analog output signal of the m-bit digital input code. The quantizer consists of an array of finite comparators in parallel such that each comparator compares the analog signal at the quantizer input to a reference voltage associated to its own output level. The reference voltage for each comparator in the array is equally spaced by the number of comparators in the array within the A/D positive full-scale and negative full-scale. A common clock latch/triggers the output of the comparators, such that each comparator generates a logic "high" (1) or a logic "low" (0) level, with the parallel output of the comparator representing a digital "thermometer code" equivalent to the analog signal at the quantizer input. This "thermometer code" is digitally processed to generate an n-bit digital word representing the converted analog signal that is the output of the modulator and also fed back into the analog filter loop via the feedback DAC. The error between the modulator analog input signal and the modulator digital output code due to the quantizer is the quantization noise Together with the analog filter, the feedback loop acts to attenuate the quantizing noise at low frequencies while emphasizing the high frequency noise. Since the signal is sampled at a frequency much higher than the Nyquist rate, i.e., a higher oversampling ratio ("OSR"), high frequency quantization noise can be removed without affecting the signal band of interest by means of a digital low-pass filter operating on the output of the sigma-delta modulator. The digital low-pass filter is implemented together with the decimation filter to convert the data from a high rate, low resolution bit stream to a lower rate, higher resolution digital output through oversampling and decimation. Hence, in operation, the sigma-delta modulator oversamples the signal and shapes the noise out of the band of interest.

In the past, the single-bit (1-bit quantizer with 1-bit feedback DAC) sigma-delta modulator has been the preferred architecture due to its low sensitivity to analog component matching by having a large OSR. This architecture has dominated the market for very high resolution but lower speed ADCs. Recently, there has been a desire for high speed, high resolution sigma-delta ADCs. Disadvantageously, sampling frequency is limited by the capability of the device and silicon process technology. Therefore, in order to achieve a higher output data rate, the ADC must have a lower OSR. Most of the higher speed sigma-delta modulators are taking advantage of the multi-bit and multi-stage noise shaping ("MASH") schemes in order to compensate for the degradation of the signal-to-noise ratio ("SNR") due to lower OSR constraints. In the multi-bit scheme, the n-bit and m-bit of the quantizer and feedback DAC respectively is more than 1. In the multi-stage scheme, more than one modulator stage is cascaded.

One of the architectural limitations for SNR and spurious-free-dynamic range ("SFDR") degradation with increasing input signal swing is due to the maximum signal swing limitation. Any given circuit block has its own maximum input signal swing limitation. An input signal that exceeds this limit is typically clipped or saturated. Signal clipping and saturation causes both harmonic and non-harmonic tones. For example, the maximum signal swing of the switched-capacitor ("SC") switch is limited by the gate driving voltage, and the maximum signal swing of the integrator is limited by the operational transconductance amplifier ("OTA") output swing which is usually limited by the power supply. The maximum signal swing limitation in a quantizer is due to the finite quantization level or the 0 dB full-scale range of the A/D converter. As previously noted, the n-bit of the quantizer and the m-bit of the feedback DAC have finite quantization levels

SUMMARY OF THE INVENTION

The present invention achieves technical advantages as a circuit arrangement and method by which the input/output swing of the quantizer in the sigma-delta modulator is reduced or kept within the limit of the finite quantization levels. Advantageously, the quantizer output swing reduction circuit and method of the present invention enables the modulator to have a larger input/output swing range without degrading the SNR and SFDR performance due to quantizer saturation and clipping.

A gradually increasing signal introduced into an A/D converter using the circuit and method of the present invention will not clip or saturate at the output of the quantizer as compared to a conventional sigma-delta modulator. Therefore, the circuit and method avoids large signal clipping that causes harmonic distortion and tones which increase the noise floor in the in-band frequency spectrum.

These and many other advantages related to the improvements of the sigma-delta modulator will become apparent to persons skilled in the relevant arts through careful reading of the disclosure and claims presented herein.

BRIEF DESCRIPTION OF THE DRAWINGS

For a better understanding of the invention including its features, advantages and specific embodiments, reference is made to the following detailed description along with accompanying drawings in which.

References in the detailed description correspond to like references in the figures unless otherwise noted.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts.

The present invention achieves technical advantages as a circuit arrangement and method by which the input/output swing of the quantizer in a sigma-delta modulator is reduced compared to a conventional sigma-delta modulator with the same input signal amplitude. The present invention improves the performance of an ADC by taking into account the quantizer output swing. With respect to the feedback DAC finite quantization limitation, it is assumed that there is no feedback DAC saturation limitation. Any input to the quantizer that is larger than the full-scale range or maximum quantization level will clip or saturate to the digital full-scale code. Signal clipping introduces harmonic distortion and tones that raise the noise floor. Therefore, the SNR and SFDR of sigma-delta modulators, even the ideal ones without circuit imperfection, start to degrade as the input signal swing increases near the 0 dB full-scale range. This is because the analog signal at the input of the quantizer consists of not only the delayed input signal component but also another component which is a function of the quantization error/noise. The present invention enables the ADC to operate with an input signal near full-scale and beyond the 0 dB full-scale range of the ADC without degradation in performance, assuming no saturation limitation on the feedback DAC or any other circuit block limitations. One embodiment of the present invention disclosed herein is implemented using a second order sigma-delta modulator. The second order sigma-delta modulator has inherent stability and a higher order of noise shaping, thus increasing the SNR of the ADC.

Figure 1A:
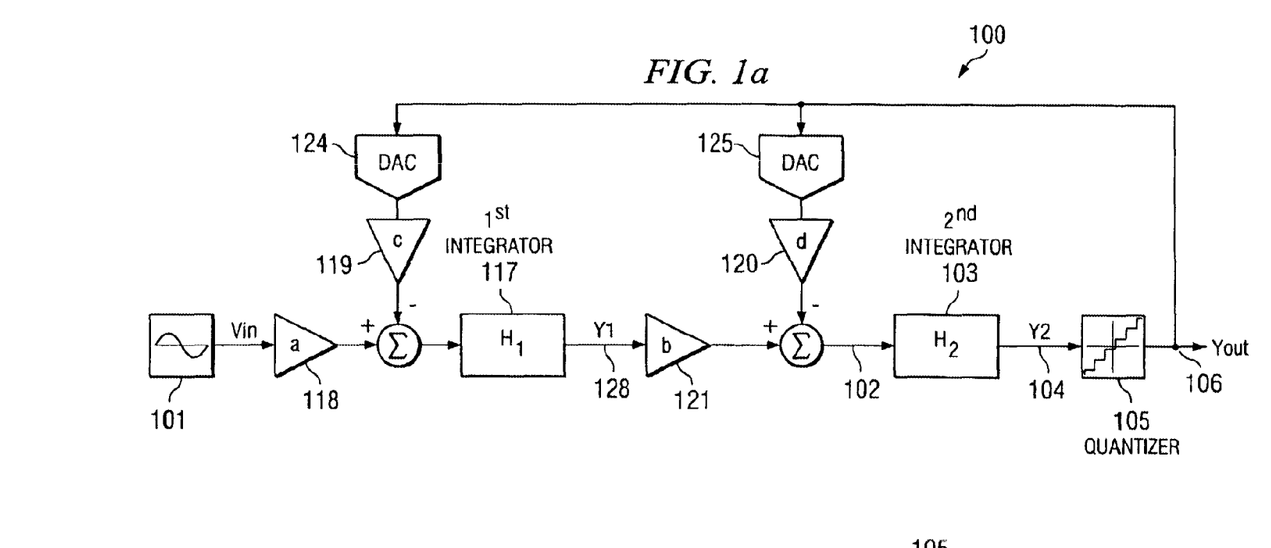
FIG. 1(a) is a block diagram of a first conventional second order sigma-delta modulator.
Figure 1B:
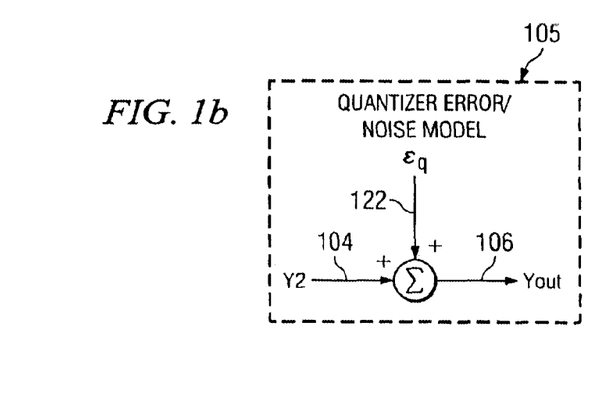
FIG. 1(b) illustrates a quantizer error/noise model.

Referring now to the Figures, FIG. 1(a) is a conventional second order sigma-delta modulator 100 shown in block diagram, which consists of the forward-path gain "a" 118 and gain "b" 121, feedback-path gain "c" 119 and gain "d" 120, first feedback DAC 124, second feedback DAC 125, first integrator 117 with transfer function H1 and second integrator 103 with transfer function H2 followed by a quantizer 105. As seen in FIG. 1(b), the quantizer 105 can be modeled as an addition of the quantization error or noise $\epsilon q$, 122 to the input Y2 104 of the quantizer 105. For any second order sigma-delta modulator, the condition for ab=1, bc=1, and c=a holds.

A conventional sigma-delta modulator 100 used in an ADC has architectural limitations that result in SNR and SFDR degradation when input signals are increased near the 0 dB full-scale voltage. This is primarily due to the limitation of the finite quantization levels. Referring to FIG. 1(a) and FIG. 1(b), the first integrator 117 output Y1 128, second integrator 103 output Y2 104, the quantizer 105 output Y3 106, and the modulator 100 output Yout 106, can be expressed as equations [1], [2], [3] and [4] below:

$$Y1 = Vin \cdot \left(\frac{H1 \cdot H2}{1 + H1 \cdot H2 + d \cdot H2}\right) \cdot \left(\frac{1}{H2} + d\right) - \varepsilon_q \cdot \left(\frac{H1}{1 + H1 \cdot H2 + d \cdot H2}\right) \quad [1]$$

$$Y2 = Vin \cdot \frac{H1 \cdot H2}{1 + H1 \cdot H2 + d \cdot H2} - \varepsilon_q \cdot \left(\frac{H1 \cdot H2 + d \cdot H2}{1 + H1 \cdot H2 + d \cdot H2}\right) \quad [2]$$

$$Y3 = Yout = Vin \cdot \frac{H1 \cdot H2}{1 + H1 \cdot H2 + d \cdot H2} + \varepsilon_q \cdot \left(\frac{1}{1 + H1 \cdot H2 + d \cdot H2}\right) \quad [3]$$

-continued $$Yout = Vin \cdot \frac{H1 \cdot H2}{1 + H1 \cdot H2 + d \cdot H2} + \varepsilon_q \cdot \left(\frac{1}{1 + H1 \cdot H2 + d \cdot H2}\right) \quad [4]$$

It can be seen that if a signal, Vin, with full-scale swing is applied at the modulator 100 input 101, the swing at the quantizer 105 output Y3 106 will swing more than the full-scale input signal, Vin, due to the addition of the quantization noise term. The conventional modulator 100, having lower quantization bits, will clip or saturate sooner than the one with higher quantization bits. However, no matter how high the quantization level, unless it is infinite, the signal through quantizer 105 will saturate before the input/output signal of the modulator 100 reaches 0 dB full-scale, causing the increase in both the distortion and the noise floor.

Figure 2:
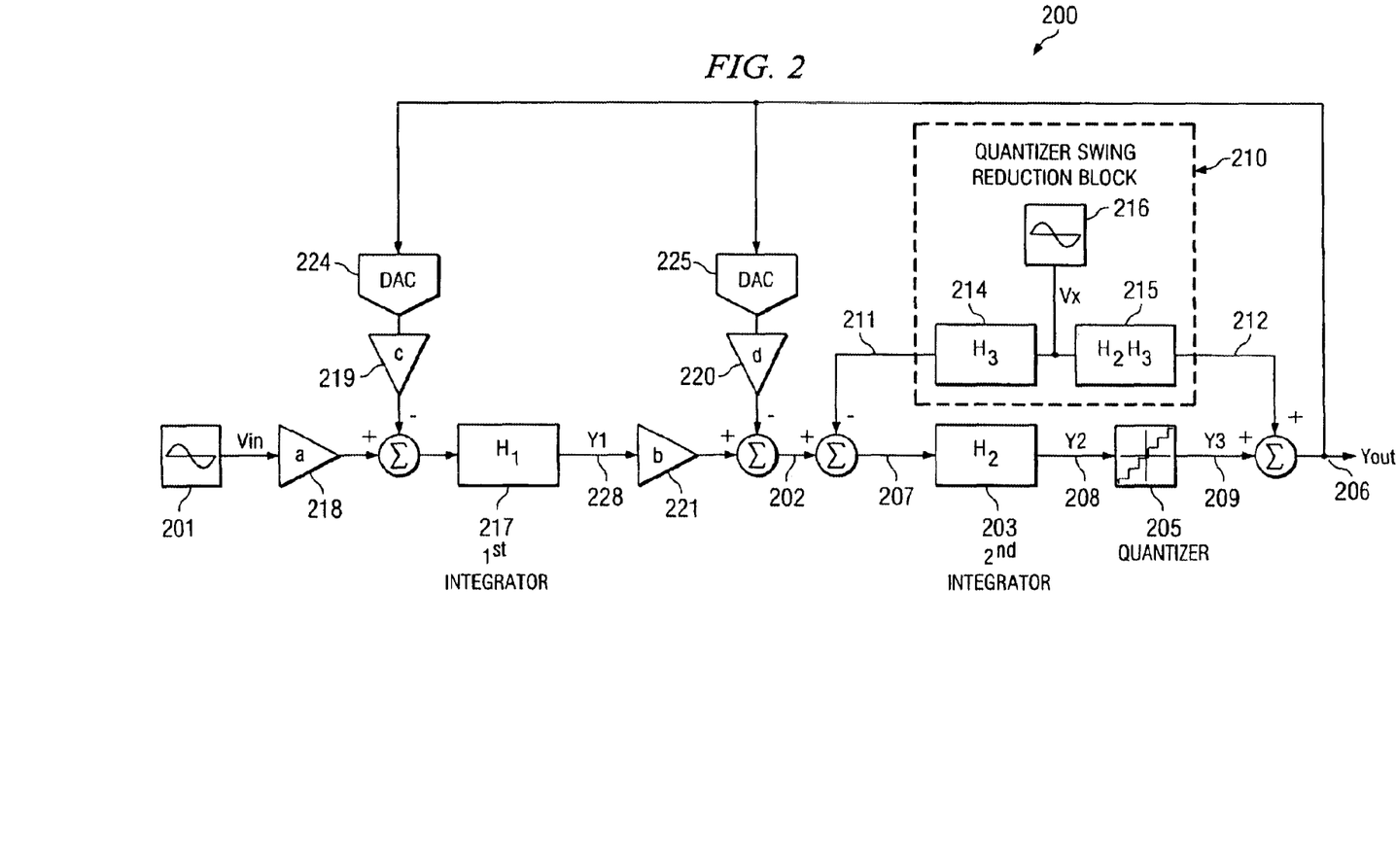
FIG. 2 is a block diagram of a first embodiment of the present invention, using an arbitrary signal, Vx, as implemented with a second order sigma-delta modulator.

As seen in FIG. 2, there is disclosed an embodiment of a sigma-delta modulation circuit 200 in accordance with the present invention. It comprises the conventional sigma-delta modulation circuit 100 of FIG. 1(a) and a quantizer swing reduction block 210. The quantizer swing reduction block 210 comprises an input signal Vx 216, a signal processing block 214 with transfer function H3 and another signal processing block 215 with transfer function H2*H3. The signal before the input 202 of the second integrator 203 with transfer function H2 is subtracted by signal 211, which is Vx 216 passed through transfer function H3 214. This is done such that the swing at the output Y2 208 of the second integrator 203 and similarly at the input 208 of the quantizer 205 will be reduced by the product of H2, H3, and Vx. Another signal 212 which is Vx 216 passed through the product of transfer function H2, and H3, 215 is added to the output 209 of the quantizer 205, before the modulator 200 output Yout 206. This is done such that the swing at the output 206 of the modulator 200 is compensated and remains the same as the output 106 of the modulator 100 of FIG. 1, without the quantizer swing reduction circuit 210. Further referring to FIG. 2, the first integrator 217 output Y1 228, second integrator 203 output Y2 208, the quantizer 205 output Y3 209, and the modulator 200 output Yout 206, can be expressed as equations [5], [6], [7]0 and [8] below:

$$Y1 = \quad [5]$$
$$Vin \cdot \left(\frac{H1 \cdot H2}{1 + H1 \cdot H2 + d \cdot H2}\right) \cdot \left(\frac{1}{H2} + d\right) - \varepsilon_q \cdot \left(\frac{H1}{1 + H1 \cdot H2 + d \cdot H2}\right)$$

$$Y2 = \quad [6]$$
$$Vin \cdot \frac{H1 \cdot H2}{1 + H1 \cdot H2 + d \cdot H2} - \varepsilon_q \cdot \left(\frac{H1 \cdot H2 + d \cdot H2}{1 + H1 \cdot H2 + d \cdot H2}\right) - Vx \cdot H2 \cdot H3$$

$$Y3 = \quad [7]$$
$$Vin \cdot \frac{H1 \cdot H2}{1 + H1 \cdot H2 + d \cdot H2} + \varepsilon_q \cdot \left(\frac{1}{1 + H1 \cdot H2 + d \cdot H2}\right) - Vx \cdot H2 \cdot H3$$

$$Yout = Vin \cdot \frac{H1 \cdot H2}{1 + H1 \cdot H2 + d \cdot H2} + \varepsilon_q \cdot \left(\frac{1}{1 + H1 \cdot H2 + d \cdot H2}\right) \quad [8]$$

The quantizer output swing reduction circuit 210 of the present invention advantageously enables the modulator 200 to have a larger input/output signal swing range without degrading the SNR and SFDR performance. Using circuit 210 of the present invention, the signal is not clipped or saturated by the quantizer 205 as early as the conventional sigma-delta modulator 100. The quantization output swing reduction method and circuit 210 can be used with any order sigma-delta modulator. The choice of transfer function, H3, depends on how much reduction is desired. In other words, H3 is not necessarily limited by a particular transfer function, it can be any arbitrary transfer function that can achieve any amount of signal swing reduction desired at the quantizer 205 output Y3 209.

Assuming that signal Vx 216, is equal to input signal Vin 201, the transfer function H3 214 can be chosen such that the product of H2 and H3 and the input signal Vin 201, can be used to completely eliminate the term due to the input signal Vin 201 at the output Y3 209 of the quantizer 205.

$$H3 = \frac{H1}{1 + H1 \cdot H2 + d \cdot H2} \quad [9]$$

Figure 3:
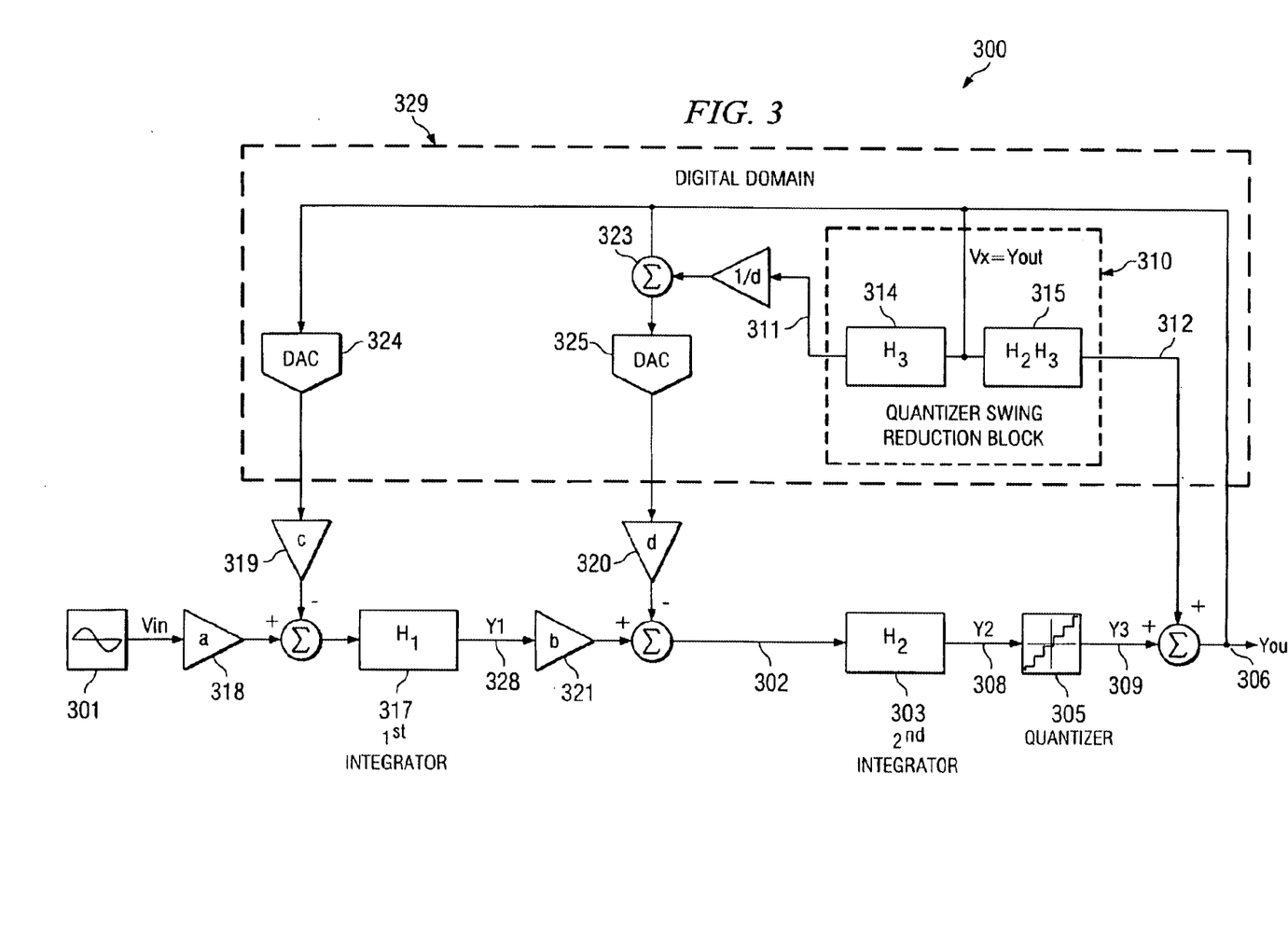
FIG. 3 is a block diagram of a second embodiment of the present invention, using the modulator output signal, Yout, as Vx, as implemented with a second order sigma-delta modulator.

Referring now to FIG. 3, modulator 300 output Yout 306, can also be used as Vx because Yout 306 is a close approximation of Vin 301 and Yout 306 is readily available. In this case, although it is not totally eliminated, the term in equation [3] related to the input voltage Vin 301, is reduced. Because Yout 306 is available in the digital domain, the whole quantizer output swing reduction circuit block 310 can be implemented in the digital domain 329. The swing reduction signal 311 can be combined 323 digitally with the output signal 306 before negatively feedback into the input 302 of the analog integrator/filter via the second feedback DAC 325.

Figure 4A:
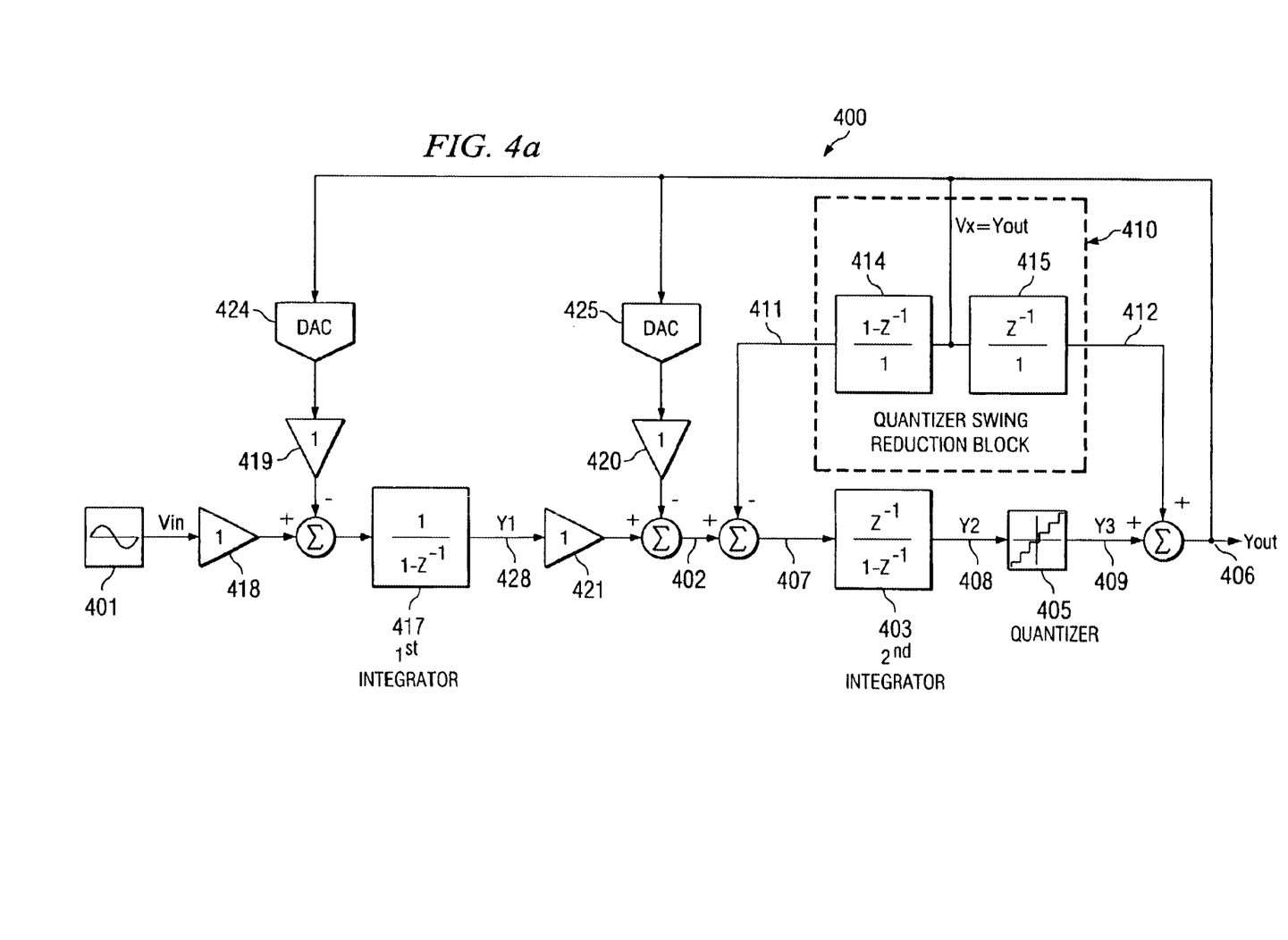
FIG. 4(a) is a block diagram of an embodiment of the present invention, using the modulator output signal, Yout, as Vx, as implemented with a second order sigma-delta modulator, including a non-delay first integrator and delay second integrator, wherein all the gain co-efficients a=b=c=d=1.

FIG. 4(a) illustrates using Yout 406 as Vx to implement the quantizer swing reduction method and circuit of the present invention with a conventional second-order sigma-delta modulator which comprises first integrator/filter 417 with transfer function $$H1 = \frac{1}{1 + Z^{-1}},$$

a second integrator/filter 403 with transfer function $$H2 = \frac{Z^{-1}}{1 + Z^{-1}}$$

and gain coefficients, "a" 418, "b" 421, "c" 419 and "d" 420 set to unity. The transfer function in the quantizer swing reduction block 410 is chosen such that H3=1−$Z^{-1}$ 414 and H2·H3=$Z^{-1}$ in order to obtain the desired node voltage at the first integrator 417 output Y1 428, second integrator 403, output Y2 408, quantizer 405 output Y3 409, and the modulator 400 output Yout 406 as expressed in equations [10], [11], [12] and [13] below:

$$Y1 = Vin - \varepsilon_q \cdot (1 - Z^{-1}) \quad [10]$$

$$Y2 = Vin \cdot Z^{-1} \cdot (1 - Z^{-1}) + \varepsilon_q \cdot [(1 - Z^{-1})^3 - 1] \quad [11]$$

$$Y3 = Vin \cdot Z^{-1} \cdot (1 - Z^{-1}) + \varepsilon_q \cdot (1 - Z^{-1})^3 \quad [12]$$

$$Yout = Vin \cdot Z^{-1} + \varepsilon_q \cdot (1 - Z^{-1})^2 \quad [13]$$

Referring to equation [12], the signal reduction at the quantizer 405 output Y3 409, is achieved by means of first order shaping on the original quantizer output swing (i.e. both the delayed modulator 400 input signal, Vin, term and the second order quantization noise, $\varepsilon_q$, shaping term).

Figure 4B:
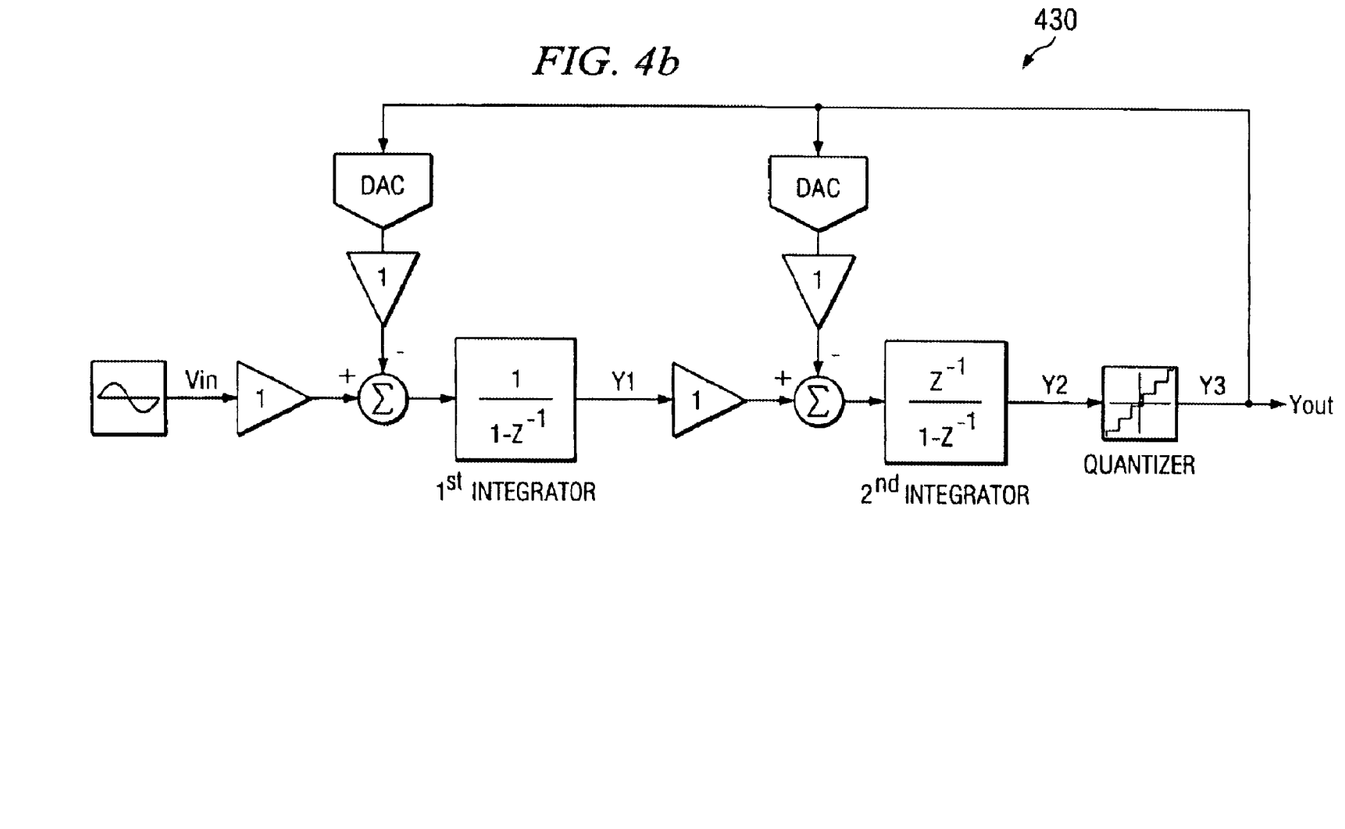
FIG. 4(b) is a block diagram of a conventional second order sigma-delta modulator with non-delay first integrator and delay second integrator, wherein all the gain co-efficients a=b=c=d=1.

As seen in FIGS. 4(a) and 4(b), a conventional second order sigma-delta modulator with 400 and without 430 the quantizer output swing reduction scheme 410 are simulated with the following parameters: OSR=32, sinusoidal input signal with amplitude, Vin=0 dB (full-scale), and frequency, Fin=38.7573242 kHz, sampling frequency, FS=40 MHz, quantizer resolution, N=3-bit unless specified on the Figure. The ideal (infinite quantization levels, i.e. quantizer resolution, N=infinity) SNR for this condition is 81.02 dB full scale ("dBFS").

Figure 5A:
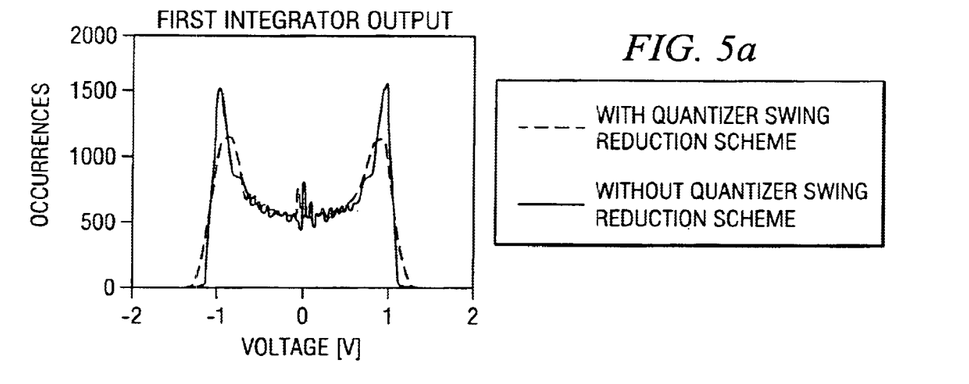
FIGS. 5(a)–(d) are plots of the probablity of occurrences at each voltage values of a sine wave input over a period of time at different output stages.
Figure 5B:
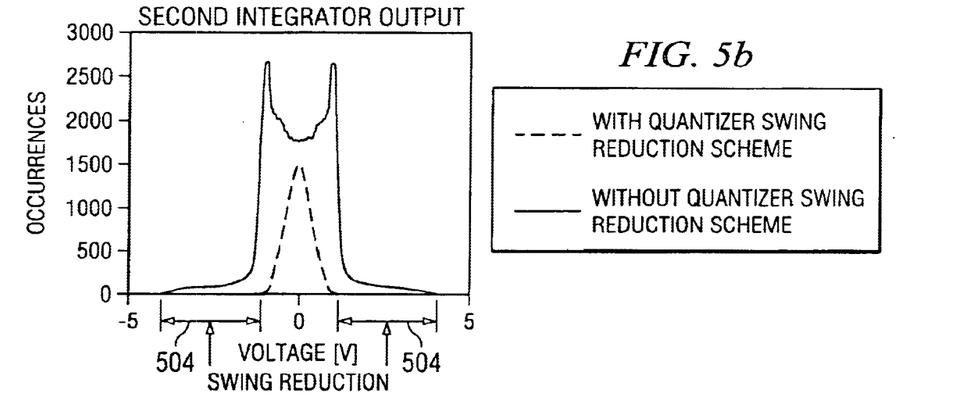
Figure 5C:
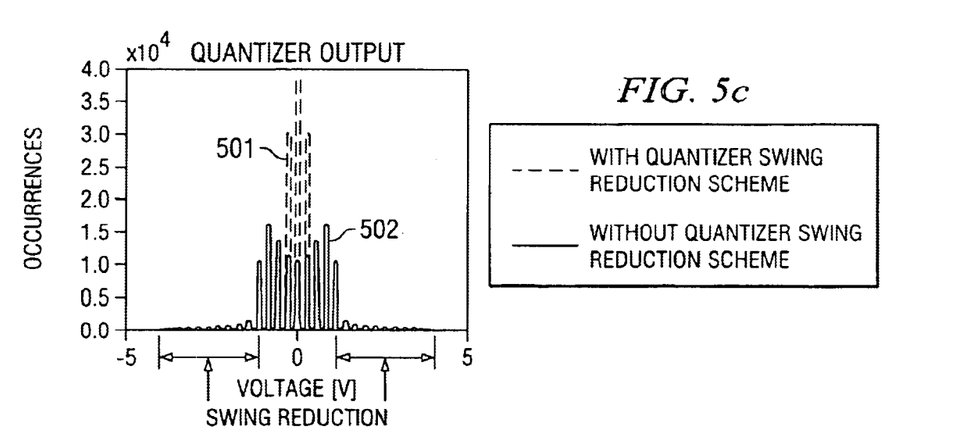
Figure 5D:
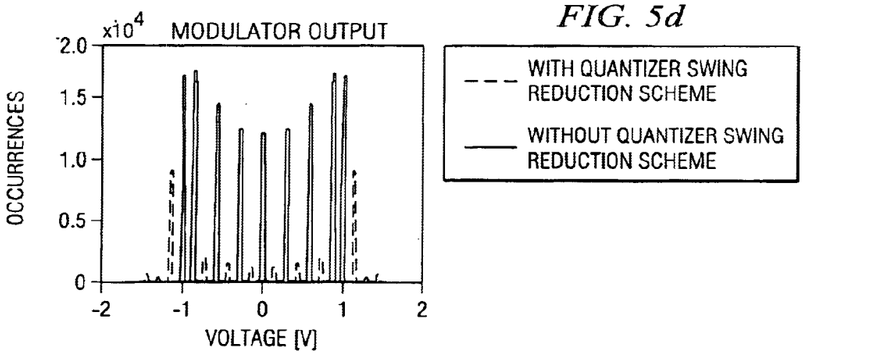

FIGS. 5(a) to (d) show the plot of output swing probability at the output of (a) first integrator, (b) second integrator, (c) quantizer, and (d) modulator of both circuits FIG. 4(a) and FIG. 4(b). It can be seen that with 0 dB full-scale input signal, a conventional second-order modulator 400 which incorporates the quantizer output swing reduction method and circuit 410 of the present invention has a smaller quantizer output swing 501 compared to the one without 502. FIGS. 5(a)–(d) graphically illustrate that the present invention helps reduce the output swing at the output of second integrator 504. As seen therein, FIGS. 5(a)–(d) are plots of the probablity of occurrences at each voltage values of a sinewave input over a period of time. FIG. 5(a) is a plot of the results from the first integrator output. FIG. 5(b) is a plot of the results from the second integrator output. FIG. 5(c) is a plot of the results from the quantizer output. FIG. 5(d) is a plot of the results from the modulator output of a second order sigma-delta modulator which implements the embodiment of the present invention seen in FIG. 4(a). This plot also indicates the maximum output swing possible at these nodes in both circuits for a particular input signal amplitude/swing.

Figure 6:
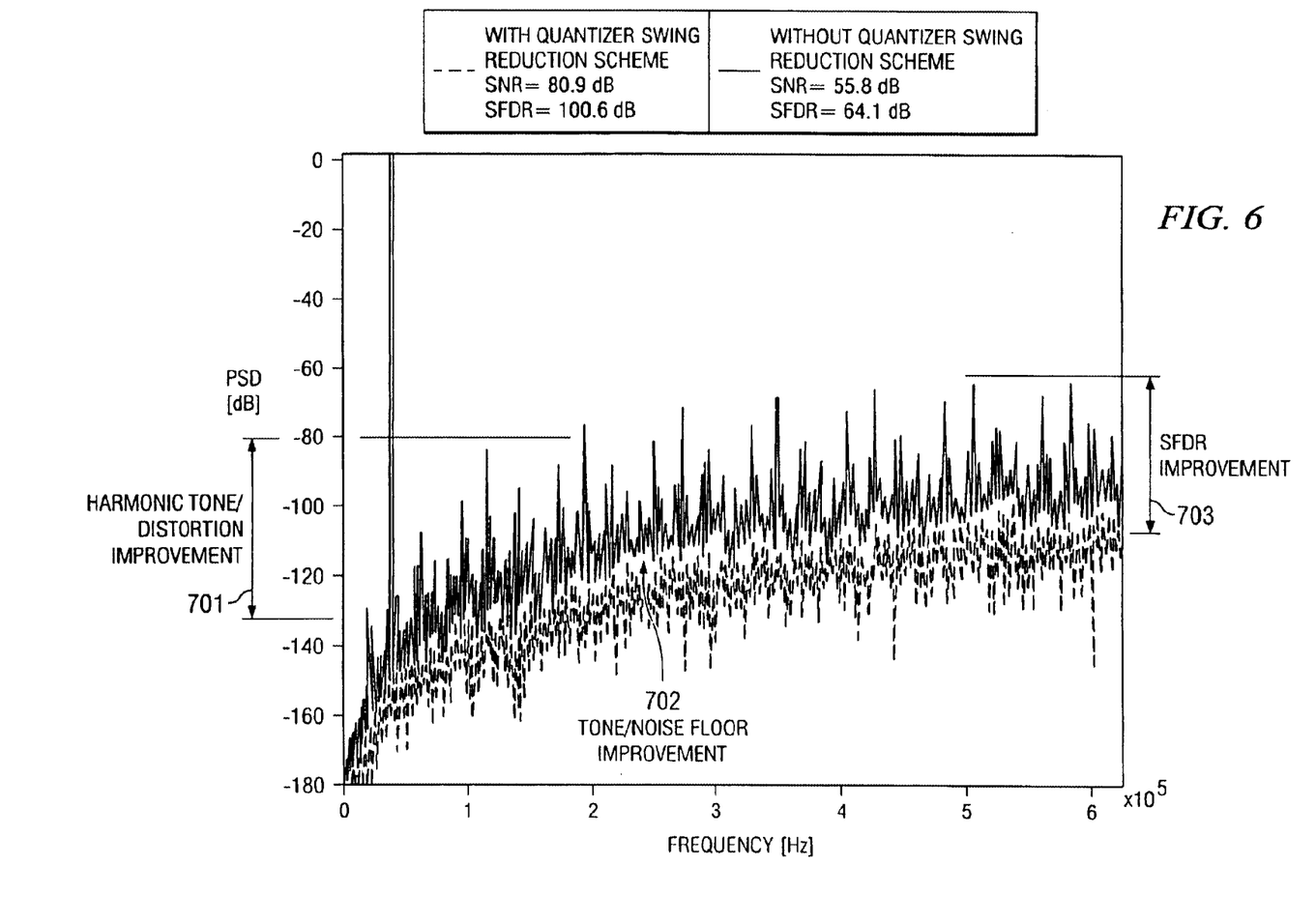
FIG. 6 is a composite plot of the in-band frequency spectrum of the output of a second order sigma-delta modulator using the present invention seen in FIG. 4(a) compared to a second order sigma-delta modulator without the present invention as seen in FIG. 4(b)

FIG. 6 is a plot of the power spectrum that shows that the second-order modulator which incorporates the quantizer output swing reduction circuit 410 of the present invention has better SNR (80.9dBFS) performance, which is close to the ideal SNR (81.02dBFS) with 0 dB full-scale input signal. The quantizer output swing of the conventional modulator 430 without the quantizer output swing reduction circuit 410 clips or is saturated before 0 dB full-scale scale input signal due to the limited finite number of levels in the quantizer.

Figure 7A:
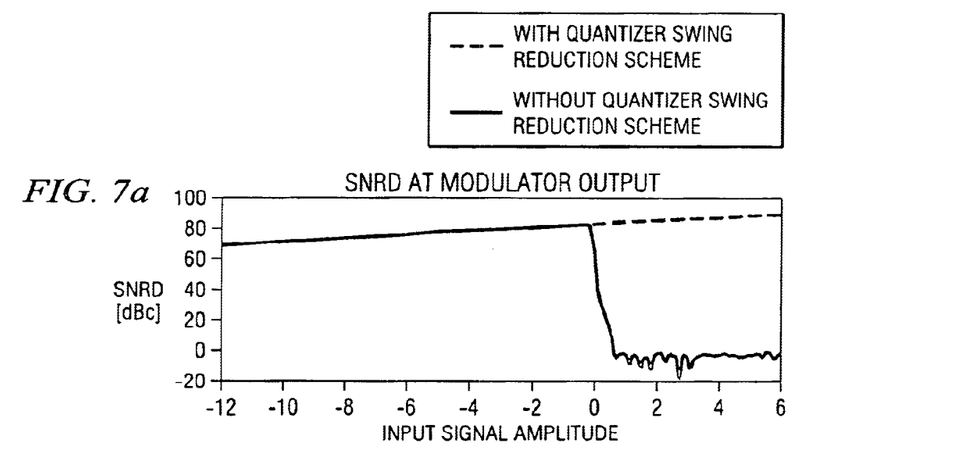
FIGS. 7(a) and (b) are plots of the SNR and SFDR performance of a second order sigma-delta modulator using the present invention as seen in FIG. 4(a) compared to a second order sigma-delta modulator without the present invention as seen in FIG. 4(b) with respect to modulator input signal swing.
Figure 7B:
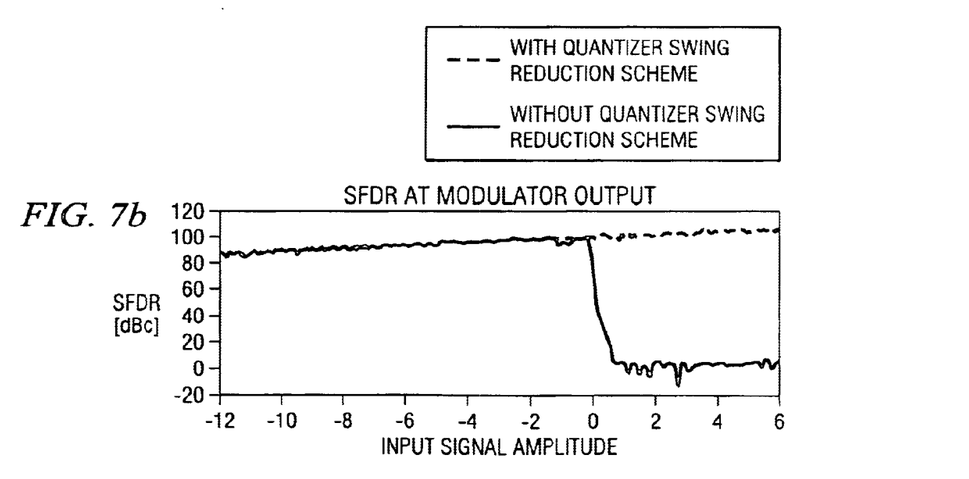

As seen in FIG. 7, harmonic tones/distortion 701, tones/noise floor 702, and SFDR 703 is improved with the quantizer swing reduction circuit 410 of the present invention. The degradation of the SNR and SFDR performance due to quantizer output signal saturation in the second order sigma-delta modulator of FIG. 4(b) compared to the one in FIG. 4(a) which incorporates the present invention as a function of modulator input signal amplitude, are shown in FIG. 7. The SNR and SFDR of the modulator 430 of FIG. 4(b) without the quantizer swing reduction method and circuit of the present invention starts to drastically drop when the modulator input signal swings near 0 dB full-scale compared to the modulator 400 with the quantizer output swing reduction method and circuit of the present invention.

Figure 8A:
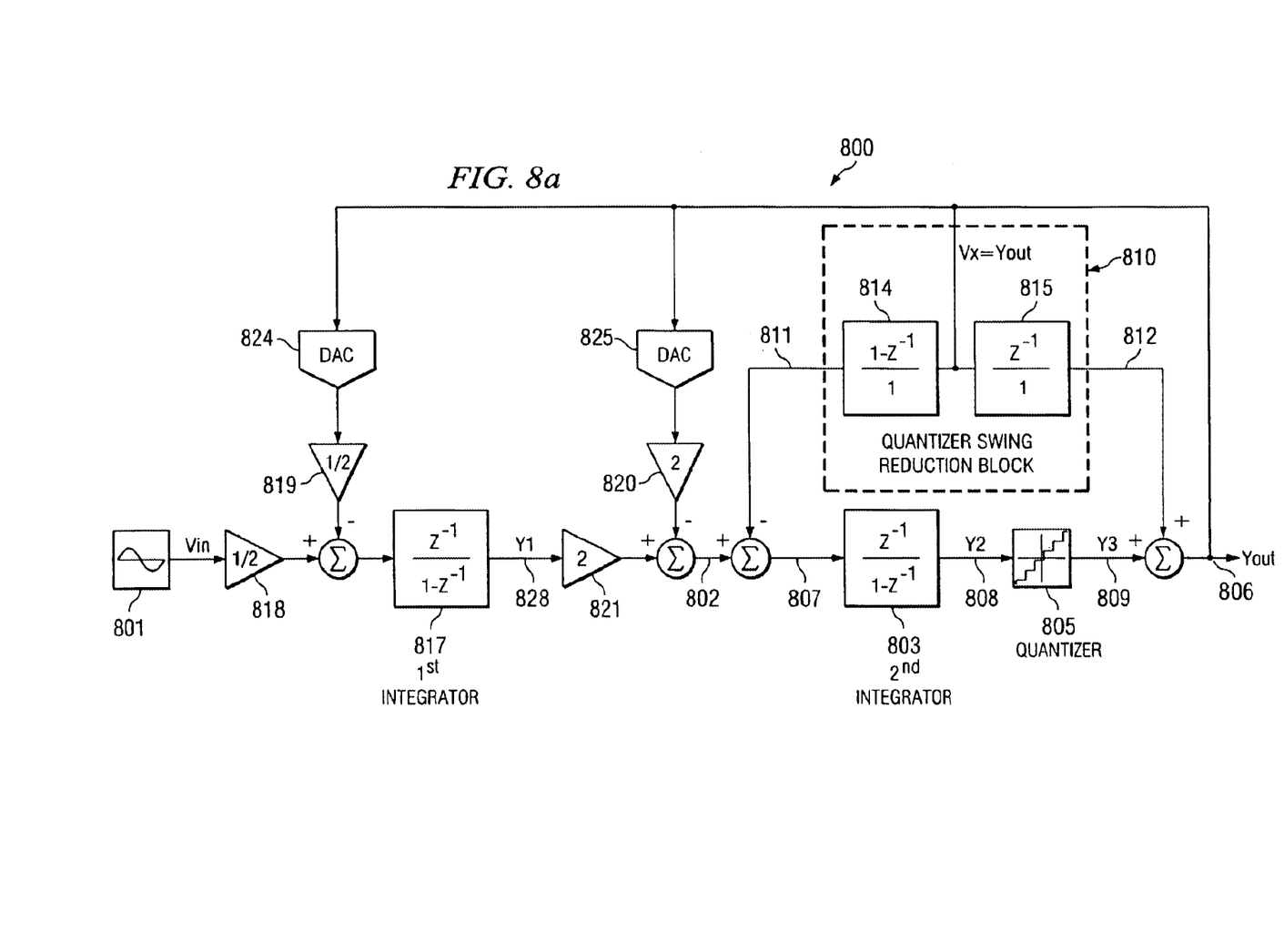
FIG. 8(a) is a block diagram of an embodiment of the present invention, using the modulator output signal, Yout as Vx, as used in a second conventional second order sigma-delta modulator with delay in both first and second integrator and the gain coefficients, a=c=½ and b=d=2.
Figure 8B:
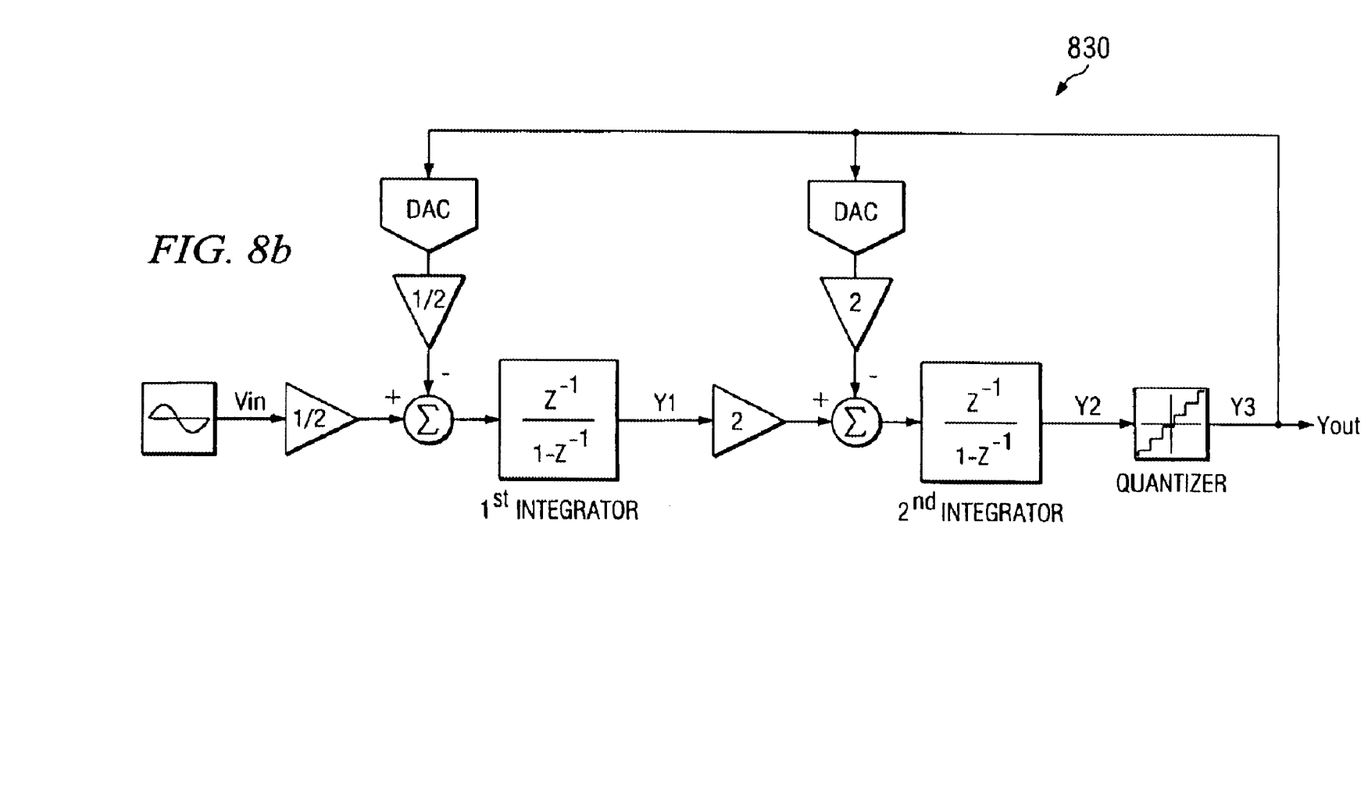
FIG. 8(b) is a block diagram of a conventional second order sigma-delta modulator with delay in both first and second integrator and the gain co-efficients, a=c=½ and b=d=2.

FIG. 8(a) illustrates using Yout as Vx to implement the proposed quantizer swing reduction method with a second-order sigma-delta modulator. The implementation of FIG. 8(a) comprises first integrator 817 and a second integrator 803 with transfer function $$H1 = H2 = \frac{Z^{-1}}{1+Z^{-1}}$$

and gain coefficients, "a" 818 and "c" 821 equal to ½, and "b" 819 and "d" 820 equal to 2. The transfer function in the quantizer swing reduction block 810 is chosen to be identical to the one used in FIG. 4(a) (seen as 410), such that $H3=1-Z^{-1}$ and $H2 \cdot H3=Z^{-1}$ in order to obtain the desired node voltage at the first integrator 817, output Y1 828, second integrator 803, output Y2 808, quantizer 805 output Y3 809, and modulator 800 output Yout 806, as expressed in equations [14], [15], [16], and [17] below:

$$Y1 = \tfrac{1}{2} \cdot [Vin \cdot Z^{-1} \cdot (1+Z^{-1}) - \epsilon_q \cdot Z^{-1} \cdot (1-Z^{-1})] \qquad [14]$$

$$Y2 = Vin \cdot Z^{-2} \cdot (1-Z^{-1}) + \epsilon_q \cdot [(1-Z^{-1})^3 - 1] \qquad [15]$$

$$Y3 = Vin \cdot Z^{-2} \cdot (1-Z^{-1}) + \epsilon_q \cdot (1-Z^{-1})^3 \qquad [16]$$

$$Yout = Vin \cdot Z^{-2} + \epsilon_q \cdot (1-Z^{-1})^2 \qquad [17]$$

Referring to equation [15], the signal reduction at quantizer 805 output Y3 809, is achieved by means of first order shaping of the original quantizer swing (i.e. both the two-delayed modulator 800 input 806 signal Vin, term and the second order quantization noise, $\epsilon_q$, shaping term).

Figure 9A:
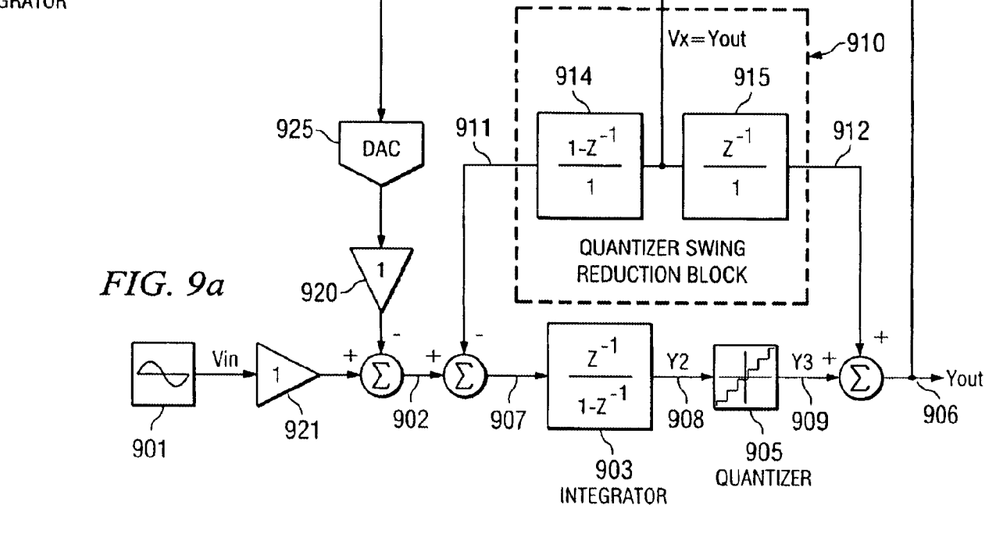
FIG. 9(a) is a block diagram of an embodiment of the present invention, using the modulator output signal, Yout as Vx, as implemented in a first order sigma-delta modulator with a delay in the first integrator and the gain coefficients, a=b=1.
Figure 9B:
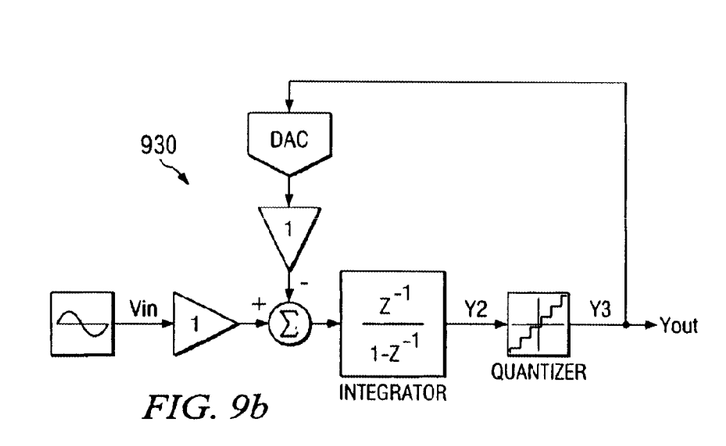
FIG. 9(b) is a schematic diagram of a conventional first order sigma-delta modulator with a delay in the first integrator and the gain coefficients, a=b=1.

The identical quantizer swing reduction circuit 410 of FIG. 4(a) can also be applied to a first order sigma-delta modulator as seen in FIG. 9(a). The node voltage at the integrator 903 Y2 output 908, the quantizer 905 output Y3 909, and modulator 900 output Yout 906, as expressed in equations [18], [19 ] and [20] below:

$$Y2 = Vin \cdot Z^{-1} \cdot (1-Z^{-1}) + \epsilon_q \cdot [(1-Z^{-1})^2 - 1] \qquad [18]$$

$$Y3 = Vin \cdot Z^{-1} \cdot (1-Z^{-1}) + \epsilon_q \cdot (1-Z^{-1})^2 \qquad [19]$$

$$Yout = Vin \cdot Z^{-1} + \epsilon_q \cdot (1-Z^{-1}) \qquad [20]$$

Referring to equation [18], the signal reduction at quantizer 905 output Y3 909 is achieved by means of first order shaping of original quantizer swing (i.e. both the delayed modulator 900 input 906 signal, Vin, term and first order quantization noise, $\epsilon_q$, shaping term).

As can be seen, a primary advantage of the quantizer output swing reduction method and circuit of the present invention is that it enables the modulator to have a larger input/output swing range without degrading the SNR and SFDR performance due to quantizer output signal clipping or saturation.

The embodiments shown and described above are only exemplary. Even though numerous characteristics and advantages of the present invention have been set forth in the foregoing description together with details of the method of the invention, the disclosure is illustrative only and changes may be made within the principles of the invention to the full extent indicated by the broad general meaning of the terms used in the attached claims.

What is claimed is:

1. A second order modulator circuit, comprising:

an input node Vin;

a signal node Vx;

an output node Yout a first signal processing circuit block with a transfer function (H3) and an input and output;

a second signal processing circuit block with a transfer function (H2*H3) and an input and output;

the signal node Vx being coupled to the input of the first signal processing circuit block and the input of the second signal processing circuit block;

a first, second, third and fourth summing nodes;

a first buffer "a" with an input and output, the input of the first buffer "a" being adapted to receive input signal Vin, the output of the first buffer "a" being coupled to the first summing node;

the output of the first signal processing circuit block being coupled to the third summing node;

the output of the second signal processing circuit block being coupled to the fourth summing node;

an n-bit quantizer with an input and output;

the quantizer output being coupled to the fourth summing node;

a first integrator circuit with a transfer function (H1) and an input and output;

a second buffer "b" with an input and output, the input of the second buffer being coupled to the output of the first integrator, the output of the second buffer "b" being coupled to the second summing node;

the second summing node being coupled to the third summing node;

a second integrator circuit with a transfer function (H2) and an input and output;

the input of the second integrator being coupled to the third summing node;

the output of the second integrator being coupled to the input of the quantizer;

a first m-bit DAC with an input and output;

a second m-bit DAC with an input and output;

a third buffer "c" with an input and output, the input of the third buffer being coupled to the output of the first DAC, the output of the third buffer "c" being coupled to the first summing node;

a fourth buffer "d" with an input and output, the input of the fourth buffer "d" being coupled to the output of the second DAC, the output of the fourth buffer "d" being coupled to the second summing node;

the output of the first signal processing circuit block being coupled to the third summing node;

the fourth summing node coupled to the output node Yout;

the circuit output Yout being coupled to the input of the first DAC and the input to the second DAC completing a feedback loop;

the first DAC and third buffer "c" forming a feedback loop to the first integrator from Yout;

the second DAC and fourth buffer "d" forming a feedback loop to the second integrator from Yout; and the quantizer swing reduction circuit operable to keep the input/output swing of the quantizer within the limit of finite quantization levels.

2. The circuit of claim 1, further comprising a signal generator operable to output signal Vx.

3. The circuit of claim 2 wherein output of the first integrator, the output of the second integrator, the output of the quantizer and the output signal Yout are:

$$Y1 = Vin \cdot \left(\frac{H1 \cdot H2}{1 + H1 \cdot H2 + d \cdot H2}\right) \cdot \left(\frac{1}{H2} + d\right) - \varepsilon_q \cdot \left(\frac{H1}{1 + H1 \cdot H2 + d \cdot H2}\right) \quad [5]$$

$$Y2 = Vin \cdot \frac{H1 \cdot H2}{1 + H1 \cdot H2 + d \cdot H2} - \varepsilon_q \cdot \left(\frac{H1 \cdot H2 + d \cdot H2}{1 + H1 \cdot H2 + d \cdot H2}\right) - Vx \cdot H2 \cdot H3 \quad [6]$$

$$Y3 = Vin \cdot \frac{H1 \cdot H2}{1 + H1 \cdot H2 + d \cdot H2} + \varepsilon_q \cdot \left(\frac{1}{1 + H1 \cdot H2 + d \cdot H2}\right) - Vx \cdot H2 \cdot H3 \quad [7]$$

$$Yout = Vin \cdot \frac{H1 \cdot H2}{1 + H1 \cdot H2 + d \cdot H2} + \varepsilon_q \cdot \left(\frac{1}{1 + H1 \cdot H2 + d \cdot H2}\right). \quad [8]$$

4. The circuit of claim 1, wherein the modulator output signal Yout is coupled to signal node Vx such that Yout, equals Vx.

5. The circuit of claim 4, wherein the first integrator does not have delay;

the second integrator has delay; and all the gain co-efficients of the first, second, third and fourth buffers equal unity.

6. The circuit of claim 4, wherein the first signal processing circuit block has a transfer function (H3) of $((1-(1/Z))/(1))$;

the first integrator circuit has a transfer function (H1) of $((1)/(1-(1/Z)))$;

the second integrator circuit has a transfer function (H2) of $((1/Z)/(1-(1/Z)))$; and the second signal processing circuit block has a transfer function (H2*H3) of $((1/Z)/(1))$.

7. The circuit of claim 6 wherein output of the first integrator, the output of the second integrator, the output of the quantizer and the output signal Yout are, respectively:

$$Y1 = Vin - \varepsilon_q \cdot (1-Z^{-1}) \quad [10]$$

$$Y2 = Vin \cdot Z^{-1} \cdot (1-Z^{-1}) + \varepsilon_q \cdot \lfloor (1-Z^{-1})^3 - 1 \rfloor \quad [11]$$

$$Y3 = Vin \cdot Z^{-1} \cdot (1-Z^{-1}) + \varepsilon_q \cdot (1-Z^{-1})^3 \quad [12]$$

$$Yout = Vin \cdot Z^{-1} + \varepsilon_q \cdot (1-Z^{-1})^2 \quad [13]$$

8. The circuit of claim 4, wherein the modulator output signal Yout is coupled to signal node Vx such that Yout, equals Vx;

the first integrator has delay;

the second integrator has delay;

the gain co-efficients of the first and second buffers equal ½; and the gain co-efficients of the third and fourth buffers equal unity.

9. The circuit of claim 4, wherein the first signal processing circuit block has a transfer function (H3) of $((1-(1/Z))/(1))$;

the first integrator circuit has a transfer function (H1) of $((1/Z)/(1-(1/Z)))$;

the second integrator circuit has a transfer function (H2) of $((1/Z)/(1-(1/Z)))$; and the second signal processing circuit block has a transfer function (H2*H3) of $((1/Z)/(1))$.

10. The circuit of claim 9 wherein output of the first integrator, the output of the second integrator, the output of the quantizer and the output signal Yout are, respectively:

$$Y1 = \frac{1}{2} \cdot [Vin \cdot Z^{-1} \cdot (1+Z^{-1}) - \varepsilon_q \cdot Z^{-1} \cdot (1-Z^{-1})] \quad [14]$$

$$Y2 = Vin \cdot Z^{-2} \cdot (1-Z^{-1}) + \varepsilon_q \cdot \lfloor (1-Z^{-1})^3 - 1 \rfloor \quad [15]$$

$$Y3 = Vin \cdot Z^{-2} \cdot (1-Z^{-1}) + \varepsilon_q \cdot (1-Z^{-1})^3 \quad [16]$$

$$Yout = Vin \cdot Z^{-2} + \varepsilon_q \cdot (1-Z^{-1})^2 \quad [17]$$

11. The circuit of claim 1 for use in a high speed analog to digital converter.

12. The circuit of claim 1 wherein the first DAC and second DAC are implemented as an array of finite capacitors configured such that a selected number of these capacitors release their electrical charge into a summing junction that produces an equivalent analog output signal of the m-bit digital input code.

13. The circuit of claim 1, further comprising an analog filter coupled between the input node Vin and the input of the first buffer "a".

14. The circuit of claim 1 operable to permit a larger input/output swing range without degrading the SNR and SFDR performance due to quantizer saturation and clipping.

15. A second order modulator circuit, comprising:
an input node Vin;
a signal node Vx;
an output node Yout;
the signal node Vx and output node Yout coupled such that Vx equals Yout;
a first signal processing circuit block with a transfer function (H3) and an input and output;
a second signal processing circuit block with a transfer function (H2*H3) and an input and output;
the signal node Vx being coupled to the input of the first signal processing circuit block and the input of the second signal processing circuit block;
a first, second, third and fourth summing nodes;
a first buffer "a" with an input and output, the input of the first buffer "a" being adapted to receive input signal Vin, the output of the first buffer "a" being coupled to the first summing node;
the output of the second signal processing circuit block being coupled to the fourth summing node;
an n-bit quantizer with an input and output;
the quantizer output being coupled to the fourth summing node;
a first integrator circuit with a transfer function (H1) and an input and output;
a second buffer "b" with an input and output, the input of the second buffer being coupled to the output of the first integrator, the output of the second buffer "b" being coupled to the second summing node;
a second integrator circuit with a transfer function (H2) and an input and output;
the second summing node being coupled to input of the second integrator;
the output of the second integrator being coupled to the input of the quantizer;
a first m-bit DAC with an input and output;
a second m-bit DAC with an input and output;
a third buffer "c" with an input and output, the input of the third buffer "c" being coupled to the output of the first DAC, the output of the third buffer "c" being coupled to the first summing node;
a fourth buffer "d" with an input and output, the input of the fourth buffer "d" being coupled to the output of the second DAC, the output of the fourth buffer "d" being coupled to the second summing node;
a fifth buffer "1/d", with an input and output, the output of the first signal processing circuit block being coupled to the fifth buffer "1d" input;
the fifth buffer "1/d" output being coupled to the third summing node;
the fourth summing node being coupled to the output node Yout;
the circuit output Yout being coupled to the input of the first DAC and the third summing node;
the third summing node being coupled to the input to the second DAC completing a feedback loop;
the first DAC and third buffer "c" forming a feedback loop to the first integrator from Yout;
the second DAC and fourth buffer "d" forming a feedback loop to the second integrator from Yout and the first signal processing circuit block (H3); and
the quantizer swing reduction circuit operable to keep the input/output swing of the quantizer within the limit of finite quantization levels.

16. The circuit of claim 15 for use in a high speed analog to digital converter.

17. The circuit of claim 15, further comprising the signal node Vx being coupled to the output node Yout such that Yout equals to signal Vx.

18. The circuit of claim 15, further comprising an analog filter coupled between the input node Vin and the input of the first buffer "a".

19. The circuit of claim 15 wherein the first DAC and second DAC are implemented as an array of finite capacitors configured such that a selected number of these capacitors release their electrical charge into a summing junction that produces an equivalent analog output signal of the m-bit digital input code.

20. The circuit of claim 19 wherein the first DAC and the second DAC are operable to produce an equivalent analog output signal of the m-bit digital input code at a junction at the output of the first integrator and input of the second integrator.

21. The circuit of claim 15 operable to permit a larger input/output swing range without degrading the SNR and SFDR performance due to quantizer saturation and clipping.

22. A sigma delta modulator circuit for use in an ADC, comprising:
at least a first and a second integrator, the input to the first integrator being coupled to an input signal source, Vin, and the output of the first integrator being coupled to the input of the second integrator;
at least one n-bit quantizer being coupled to the output of the second integrator;
at least one m-bit DAC;
the quantizer being enclosed in a feedback loop via the m-bit DAC;
the DAC is operable to produce an equivalent analog output signal of the m-bit digital input code at a junction at the output of the first integrator and input of the second integrator;
a quantizer swing reduction circuit coupled between the output of the quantizer and the input to the second integrator, operable to keep the input/output swing of the quantizer within the limit of the finite quantization levels.

23. The circuit of claim 22 wherein the DAC is implemented as an array of finite capacitors configured such that a selected number of these capacitors release their electrical charge into a summing junction that produces an equivalent analog output signal of the m-bit digital input code.

24. The circuit of claim 23 wherein the DAC is operable to produce an equivalent analog output signal of the m-bit digital input code at a junction at the output of the first integrator and input of the second integrator.

25. A quantizer swing reduction circuit, comprising:
an input signal generator with an output terminal operable to output a signal Vx;
a first signal processing circuit block with a transfer function (H3) and an input and output terminal;
a second signal processing circuit block with a transfer function (H2*H3) and an input and output terminal;
the output terminal of the input signal generator being coupled to the input of the first signal processing circuit block and the input of the second signal processing circuit block;
the output of the first signal processing circuit block being coupled to an output of a first integrator; and
the output of the second signal processing circuit block being coupled to an output of a quantizer.

26. The quantizer swing reduction circuit of claim 25 further comprising:

at least one integrator circuit;

a quantizer circuit;

a feedback DAC circuit coupling the quantizer to the integrator circuit;

the quantizer swing reduction circuit being coupled between the output of the quantizer circuit and the input to an integrator; and said quantizer swing reduction circuit operable to keep the input/output swing of the quantizer within the limit of the finite quantization levels.

27. The circuit of claim 26 wherein the quantizer circuit consists of an array of finite comparators in parallel such that each comparator compares the analog signal at the quantizer input to a reference voltage associated to its own output level.

28. The circuit of claim 27 wherein the reference voltage for each comparator in the array is equally spaced by the number of comparators in the array within the A/D positive full-scale and negative full-scale;

a common clock latch/triggers the output of the comparators, such that each comparator generates a logic "high" (1) or a logic "low" (0) level, with the parallel output of the comparator representing a digital code equivalent to the analog signal at the quantizer input;

the code being digitally processed to generate an n-bit digital word representing the converted analog signal that is the output of the modulator and also fed back into a analog filter loop via the feedback DAC; and the error between the modulator analog input signal and the modulator digital output code due to the quantizer is the quantization noise.

29. A modulator circuit, comprising:

an input node Vin;

a signal node Vx;

an output node Yout;

a first signal processing circuit block with a transfer function (H3) and an input and output;

a second signal processing circuit block with a transfer function (H2*H3) and an input and output;

the signal node Vx being coupled to the input of the first signal processing circuit block and the input of the second signal processing circuit block;

a first, second and third summing nodes;

a first buffer "a" with an input and output, the input of the first buffer "a" being adapted to receive input signal Vin, the output of the first buffer "a" being coupled to the first summing node;

the output of the first signal processing circuit block being coupled to the second summing node;

the output of the second signal processing circuit block being coupled to the third summing node;

an n-bit quantizer with an input and output;

the quantizer output being coupled to the third summing node;

an integrator circuit with a transfer function (H1) and an input and output;

the output of the integrator being coupled to the input of the quantizer;

an m-bit DAC with an input and output;

a second buffer "b" with an input and output, the input of the second buffer being coupled to the output of the DAC, the output of the second buffer "b" being coupled to the first summing node;

the output of the first signal processing circuit block being coupled to the second summing node;

the third summing node coupled to the output node Yout;

the circuit output Yout being coupled to the input of the DAC completing a feedback loop;

the quantizer swing reduction circuit operable to keep the input/output swing of the quantizer within the limit of finite quantization levels.

30. The circuit of claim 29, wherein output signal, Yout is coupled to signal node Vx, such that Yout equals Vx;

the integrator having a delay; and the gain co-efficients of the first and second buffers equal unity.

31. The circuit of claim 29, wherein the first signal processing circuit block has a transfer function (H3) of $((1-(1/Z))/(1))$;

the integrator has a transfer function (H1) of $((1/Z)/(1-(1/Z)))$; and the second signal processing circuit block has a transfer function (H2*H3) of $((1/Z)/(1))$.

32. The circuit of claim 31 wherein output of the integrator, the output of the quantizer and the output signal Yout are, respectively:

$$Y2 = V\text{in} \cdot Z^{-1} \cdot (1-Z^{-1}) + \epsilon_q \cdot [(1-Z^{-1})^2 - 1] \qquad [18]$$

$$Y3 = V\text{in} \cdot Z^{-1} \cdot (1-Z^{-1}) + \epsilon_q \cdot (1-Z^{-1})^2 \qquad [19]$$

$$Y\text{out} = V\text{in} \cdot Z^{-1} + \epsilon_q \cdot (1-Z^{-1}) \qquad [20].$$

* * * * *

UNITED STATES PATENT AND TRADEMARK OFFICE
CERTIFICATE OF CORRECTION

PATENT NO. : 6,940,438 B2
DATED : September 6, 2005
INVENTOR(S) : Wern Ming Koe, Franco Maloberti and James Robert Hochschild It is certified that error appears in the above-identified patent and that said Letters Patent is hereby corrected as shown below:

<u>Title page,</u>
Item [75], should read:
-- Inventors: Wern Ming Koe, Dallas, TX (US)
          Franco Maloberti, Plano, TX (US)
          James Robert Hochschild, Plano, TX (US) --.

Signed and Sealed this

Tenth Day of January, 2006

JON W. DUDAS
*Director of the United States Patent and Trademark Office*